United States Patent
Takahashi et al.

(10) Patent No.: US 9,933,491 B2
(45) Date of Patent: Apr. 3, 2018

(54) ELECTRIC STORAGE SYSTEM

(75) Inventors: Kenji Takahashi, Toyota (JP); Yuji Nishi, Nagoya (JP); Hiroyuki Kaiya, Toyota (JP); Kenji Kimura, Miyoshi (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 405 days.

(21) Appl. No.: 14/355,724

(22) PCT Filed: Feb. 3, 2012

(86) PCT No.: PCT/JP2012/000750
§ 371 (c)(1),
(2), (4) Date: May 1, 2014

(87) PCT Pub. No.: WO2013/114468
PCT Pub. Date: Aug. 8, 2013

(65) Prior Publication Data
US 2014/0335387 A1 Nov. 13, 2014

(51) Int. Cl.
*G01R 31/36* (2006.01)
*H01M 2/34* (2006.01)
(Continued)

(52) U.S. Cl.
CPC .......... *G01R 31/3634* (2013.01); *H01M 2/34* (2013.01); *H01M 10/425* (2013.01);
(Continued)

(58) Field of Classification Search
CPC .. G01R 31/3634; H01M 2/34; H01M 10/425; H01M 10/482; H01M 2200/00; H01M 2220/20
See application file for complete search history.

(56) References Cited

U.S. PATENT DOCUMENTS

| 8,006,788 B2 | 8/2011 | Soma et al. |
| 2003/0195719 A1 | 10/2003 | Emori et al. |

(Continued)

FOREIGN PATENT DOCUMENTS

| EP | 2 343 768 A2 | 7/2011 |
| JP | A-5-275116 | 10/1993 |

(Continued)

OTHER PUBLICATIONS

Jul. 16, 2015 Office Action issued in U.S. Appl. No. 13/577,303.
(Continued)

*Primary Examiner* — Mohamed Charioui
*Assistant Examiner* — Catherine Rastovski
(74) *Attorney, Agent, or Firm* — Oliff PLC (57) ABSTRACT

An electric storage system includes electric storage blocks and a controller determining the state of each of the electric storage blocks. The plurality of electric storage blocks are connected in series, and each of the electric storage blocks has a plurality of electric storage elements connected in parallel. Each of the electric storage elements has a current breaker breaking a current path within the electric storage element. The controller acquires at least one parameter of an internal resistance and a full charge capacity of each of the electric storage blocks, and uses a change rate between the acquired parameter and a reference value to specify the number of current breakers in a broken state (the number of breaks) in each of the electric storage blocks. The reference value refers to the value of the parameter in the electric storage block not including the current breaker in the broken state.

9 Claims, 5 Drawing Sheets

(51) Int. Cl.
*H01M 10/42* (2006.01)
*H01M 10/48* (2006.01)

(52) U.S. Cl.
CPC ...... *H01M 10/482* (2013.01); *H01M 2200/00* (2013.01); *H01M 2220/20* (2013.01)

(56) References Cited

U.S. PATENT DOCUMENTS

| | | | |
|---|---|---|---|
| 2010/0320969 A1* | 12/2010 | Sakakibara | H01M 2/1022 320/118 |
| 2011/0148361 A1* | 6/2011 | Yokotani | H01M 10/482 320/136 |
| 2012/0119749 A1 | 5/2012 | Iida | |
| 2014/0335387 A1 | 11/2014 | Takahashi et al. | |
| 2014/0343876 A1 | 11/2014 | Takahashi et al. | |

FOREIGN PATENT DOCUMENTS

| | | |
|---|---|---|
| JP | 2006-138750 A | 6/2006 |
| JP | 2006-197790 A | 7/2006 |
| JP | 2008-182779 A | 8/2008 |
| JP | 2011-137682 A | 7/2011 |
| JP | A-2011-135657 | 7/2011 |
| WO | 2011/118112 A1 | 9/2011 |

OTHER PUBLICATIONS

Feb. 23, 2015 Office Action issued in U.S. Appl. No. 13/577,303.
Das, J., "Statistics for Business Decisions," Academic Publishers, Kolkata, 2010.
Apr. 5, 2016 Office Action issued in U.S. Appl. No. 13/577,303.
Nov. 2, 2015 Office Action issued in U.S. Appl. No. 13/577,303.
Feb. 23, 2017 Office Action issued in U.S. Appl. No. 13/577,303.
October 3, 2016 Office Action issued in U.S. Appl. No. 13/577,303.

* cited by examiner

ELECTRIC STORAGE SYSTEM

TECHNICAL FIELD

The present invention relates to an electric storage system in which a plurality of electric storage elements each having a current breaker are connected in parallel in an electric storage block and the operational state of the current breaker is determined in the electric storage block.

BACKGROUND ART

Patent Document 1 has described an assembled battery having a plurality of cells connected in parallel in which a fuse is connected to each of the cells connected in parallel. Upon passage of an excessive current, the fuse is melted to break a current path. Patent Document 2 has described a technology in which the operation of a current breaking mechanism included in a cell is detected on the basis of a change in internal resistance of the cell.

PRIOR ART DOCUMENT

Patent Documents

Patent Document 1: Japanese Patent Laid-Open No. 05-275116
Patent Document 2: Japanese Patent Laid-Open No. 2008-182779
Patent Document 3: Japanese Patent Laid-Open No. 2011-135657

DISCLOSURE OF THE INVENTION

Problems to be Solved by the Invention

In the configuration including the plurality of cells connected in parallel, the value of a current passing through the cell in which the current breaker is not operated is changed in accordance with the number of operating current breakers. Specifically, as the number of operating current breakers is increased, the value of a current passing•through the cell in which the current breaker is not operated is increased to add a current load on the cell.

While the increased current load on the cell can be suppressed by limiting charge and discharge of the cell, the control of the charge and discharge of the cell can not be efficiently performed unless the number of operating current breakers is specified. In other words, only the detection of the operational state of the current breaker may lead to excessive limitation of the charge and discharge of the cell. The number of operating current breakers needs to be found in order to prevent the excessive limitation of the charge and discharge of the cell. The technology described in Patent Document 2 only allows the detection of the operational state of the current breaker and can not specify the number of operating current breakers.

Means for Solving the Problems

According to a first aspect, the present invention provides an electric storage system including a plurality of electric storage blocks and a controller determining the state of each of the electric storage blocks. The plurality of electric storage blocks are connected in series, and each of the electric storage blocks has a plurality of electric storage elements connected in parallel. Each of the electric storage elements has a current breaker breaking a current path within the electric storage element. The controller acquires at least one parameter of an internal resistance and a full charge capacity of each of the electric storage blocks. The controller uses a change rate between the acquired parameter and a reference value to specify the number of current breakers in a broken state (the number of breaks) in each of the electric storage blocks. The reference value refers to the value of the parameter in the electric storage block not including the current breaker in the broken state.

When the current path is broken by the current breaker, the change rate of the parameter is changed in accordance with the number of the current breakers in the broken state. For example, when any current breaker is operated, the internal resistance of the electric storage block including that current breaker in the broken state is higher than the internal resistance (reference value) of the electric storage block not including the current breaker in the broken state. The change rate of the internal resistance is changed in accordance with the number of the current breakers in the broken state. When any current breaker is operated, the full charge capacity of the electric storage block including that current breaker in the broken state is lower than the full charge capacity (reference value) of the electric storage block not including the current breaker in the broken state. The change rate of the full charge capacity is changed in accordance with the number of the current breakers in the broken state.

Once the change rate of the parameter (the internal resistance or the full charge capacity) is calculated, the number of breaks can be specified from the change rate. The specification of the number of breaks allows the specification of the value of a current passing through the electric storage, element in each of the electric storage blocks, so that charge and discharge of the electric storage block can be controlled such that the current load on the electric storage element is not increased. Since the plurality of electric storage elements are connected in parallel in each of the electric storage blocks, the value of the current passing through the electric storage element is increased as the number of breaks is increased. Thus, the number of breaks needs to be obtained in order to suppress the increase in current load on the electric storage element.

The number of breaks can be specified by using the change rate between the present parameter and the previous parameter serving as the reference value. The previous parameter is the parameter of the electric storage block not including the current breaker in the broken state. The parameter of each of the electric storage blocks is acquired over time, and the previous parameter and the present parameter can be used to calculate the change rate of the parameter.

The parameter in another one of the electric storage blocks can be used as the reference value. The plurality of electric storage blocks often include both of the electric storage block including the current breaker in the broken state (referred to as a first electric storage block) and the electric storage block not including the current breaker in the broken state (referred to as a second electric storage block). The number of breaks can be specified by using the change rate calculated from the parameter of the first electric storage block and the parameter of the second electric storage block.

The parameter changed in association with deterioration of the electric storage block and specified previously can be used as the reference value. The changes in the parameter associated with the deterioration of the electric storage block can be previously specified by experiment. The parameter of the electric storage block including the current breaker in the operational state is deviated from the parameter changed in association with the deterioration of the electric storage block. Thus, these parameters can be used to calculate the change rate, thereby specifying the number of breaks.

The internal resistance of each of the electric storage blocks is acquired, and when the acquired internal resistance is higher than the internal resistance associated with the deterioration of the electric storage block, the number of breaks can be specified. Since the internal resistance of the electric storage block including the current breaker in the broken state is higher than the internal resistance associated with the deterioration, the relationship between these internal resistances are found and thus the number of breaks can be specified.

The full charge capacity of each of the electric storage blocks is acquired, and when the acquired full charge capacity is lower than the full charge capacity associated with the deterioration of the electric storage block, the number of breaks can be specified. Since the full charge capacity of the electric storage block including the current breaker in the broken state is lower than the full charge capacity associated with the deterioration, the relationship between these full charge capacities are found and thus the number of breaks can be specified.

The value of a voltage change amount changing with a change in the internal resistance of each of the electric storage blocks can be used as the value of the internal resistance. Since the plurality of electric storage blocks are connected in series, the values of currents passing the electric storage blocks are equal to each other. Thus, the internal resistance of each of the electric storage blocks has a proportional relationship with the voltage change amount of each of the electric storage blocks, and the voltage change amount can be used instead of the internal resistance.

The number of breaks can be specified when a value calculated by multiplying the change rate in the internal resistance by the change rate in the full charge capacity falls within an allowable range including 1 as a reference. When any current breaker is operated, the change rate in the internal resistance is the inverse of the change rate in the full charge capacity, so that the value calculated by multiplying the change rate in the internal resistance by the change rate in the full charge capacity is 1. The result of the multiplication of the change rates can be compared with 1 to determine whether or not any current breaker is operational. The allowable range including 1 as the reference can be set in view of errors of the change rates in the internal resistance and the full charge capacity.

A fuse, a PTC element, or a current breaking valve can be used as the current breaker. The fuse breaks the current path through melting. The PTC element breaks the current path through an increased resistance associated with a temperature rise. The current breaking valve is deformed in response to an increased internal pressure of the electric storage element to break the current path.

According to a second aspect, the present invention provides a method of determining the state of a plurality of electric storage blocks connected in series, each of the electric storage blocks having a plurality of electric storage elements connected in parallel. Each of the electric storage elements has a current breaker breaking a current path within the electric storage element. At least one parameter of an internal resistance and a full charge capacity of each of the electric storage blocks is acquired. A change rate between the acquired parameter and a reference value is used to specify the number of current breakers in a broken state (the number of breaks) in each of the electric storage blocks. The second aspect of the present invention can achieve the same advantages as those in the first aspect of the present invention.

MODE FOR CARRYING OUT THE INVENTION

Embodiments of the present invention will hereinafter be described.

Embodiment 1

Figure 1:
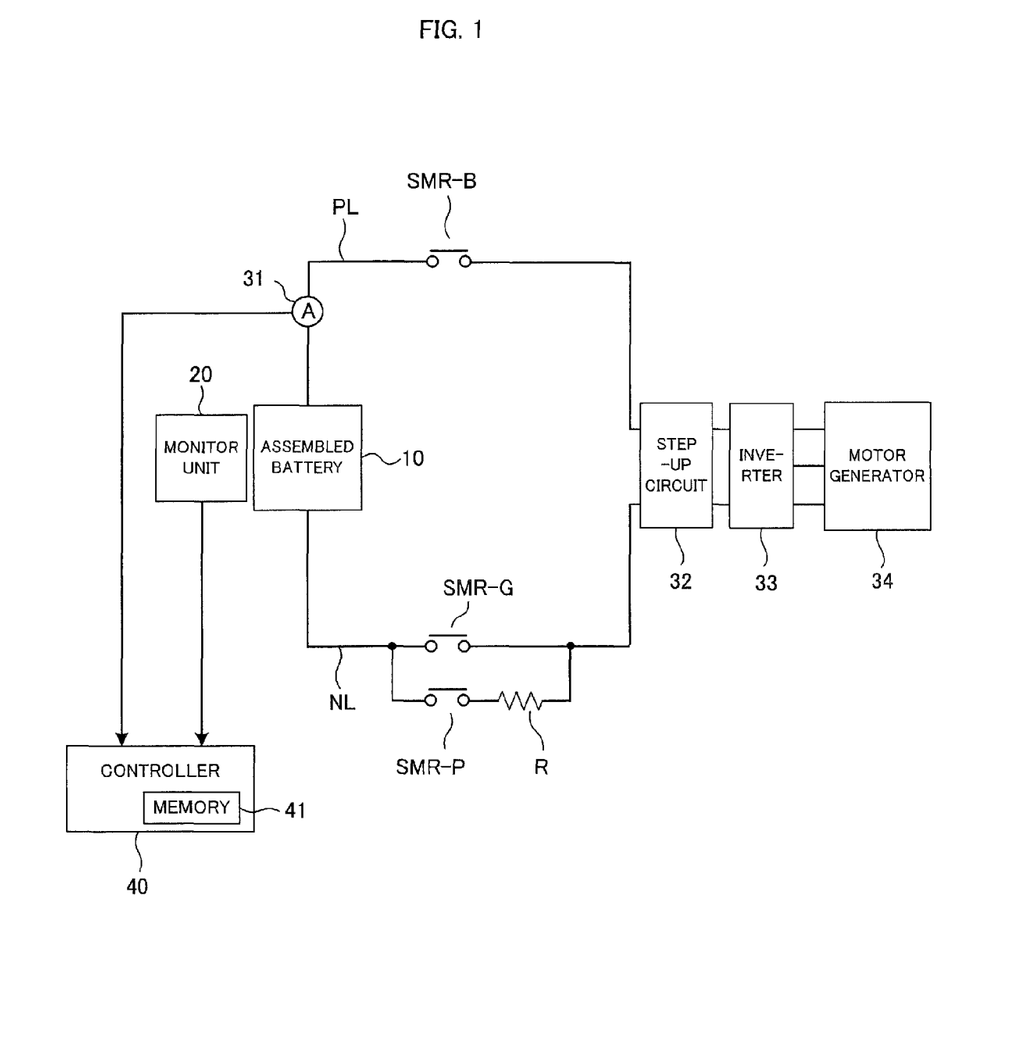
FIG. 1 is a diagram showing the configuration of a battery system.

A battery system (corresponding to an electric storage system) which is Embodiment 1 of the present invention is described with reference to FIG. 1. FIG. 1 is a diagram showing the configuration of the battery system. The battery system of the present embodiment is mounted on a vehicle.

Examples of the vehicle include a hybrid vehicle and an electric vehicle. The hybrid vehicle includes an engine or a fuel cell in addition to an assembled battery, later described, as the power source for running of the vehicle. The electric vehicle includes only the assembled battery, later described, as the power source for running of the vehicle.

A system main relay SMR-B is provided on a positive electrode line PL connected to a positive electrode terminal of the assembled battery 10. The system main relay SMR-B is switched between ON and OFF in response to a control signal from a controller 40. A system main relay SMR-G is provided on a negative electrode line NL connected to a negative electrode terminal of the assembled battery 10. The system main relay SMR-G is switched between ON and OFF in response to a control signal from the controller 40.

The system main relay SMR-G is connected in parallel to a system main relay SMR-P and a current limiting resistor R. The system main relay SMR-P and the current limiting resistor R are connected in series. The system main relay SMR-P is switched between ON and OFF in response to a control signal from the controller 40. The current limiting resistor R is used to prevent an inrush current from passing in connecting the assembled battery 10 to a load (specifically, a step-up circuit 32, later described).

In connecting the assembled battery 10 to the load, the controller 40 first switches the system main relays SMR-B and SMR-P from OFF to ON. This can pass a current through the current limiting resistor R to prevent the inrush current from passing.

Next, the controller 40 switches the system main relay SMR-G from OFF to ON and then switches the system main relay SMR-P from ON to OFF. This completes the connection between the assembled battery 10 and the load to render the battery system shown in FIG. 1 operational (Ready-On). On the other hand, in breaking the connection between the assembled battery 10 and the load, the controller 40 switches the system main relays SMR-B and SMR-G from ON to OFF. This stops the operation of the battery system shown in FIG. 1.

The step-up circuit 32 increases an output voltage from the assembled battery 10 and outputs the electric power after increasing voltage to an inverter 33. The step-up circuit 32 also reduces an output voltage from the inverter 33 and outputs the electric power after reducing voltage to the assembled battery 10. The step-up circuit 32 operates in response to a control signal from the controller 40. While the step-up circuit 32 is used in the battery system of the present embodiment, the step-up circuit 32 may be omitted.

The inverter 33 converts a DC power output from the step-up circuit 32 into an AC power and outputs the AC power to a motor generator 34. The inverter 33 converts an AC power generated by the motor generator 34 into a DC power and outputs the DC power to the step-up circuit 32. A three-phase AC motor can be used as the motor generator 34, for example.

The motor generator 34 receives the AC power from the inverter 33 to generate a kinetic energy for running of the vehicle. In using the output electric power from the assembled battery 10 to run the vehicle, the kinetic energy generated by the motor generator 34 is transferred to wheels.

For decelerating or stopping the vehicle, the motor generator 34 converts a kinetic energy generated in braking of the vehicle into an electric energy (AC power). The inverter 33 converts the AC power generated by the motor generator 34 into a DC power and outputs the DC power to the step-up circuit 32. The step-up circuit 32 outputs the electric power from the inverter 33 to the assembled battery 10. Thus, the regenerative electric power can be stored on the assembled battery 10.

Figure 2:
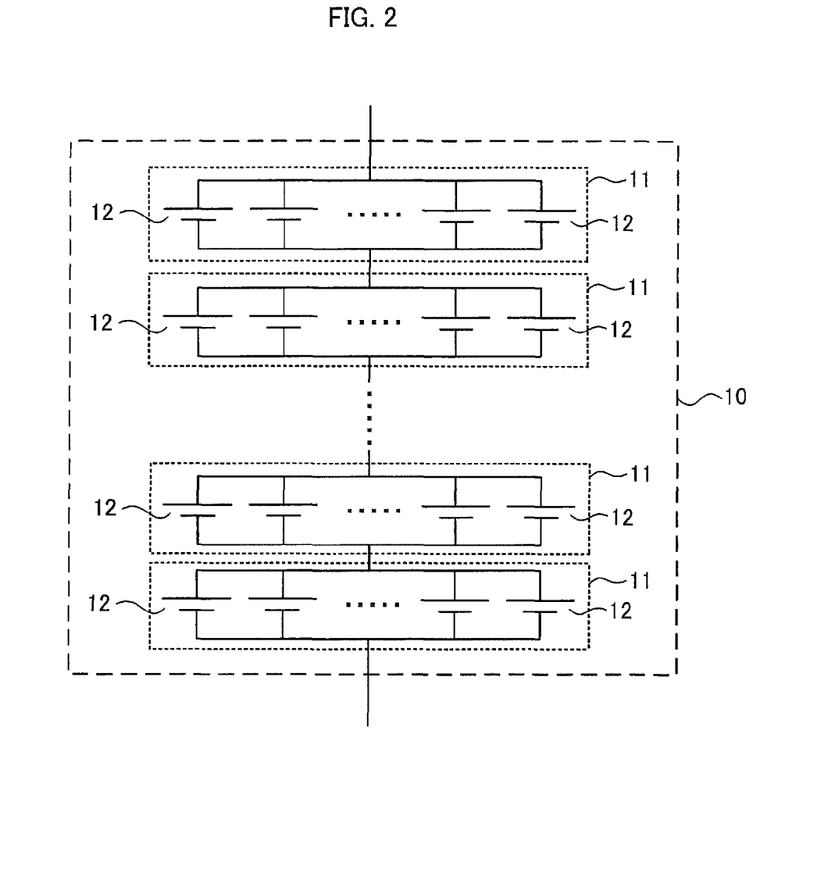
FIG. 2 is a diagram showing the configuration of an assembled battery.

FIG. 2 shows the configuration of the assembled battery 10. The assembled battery 10 has a plurality of battery blocks (corresponding to electric storage blocks) 11 connected in series. The series connection of the plurality of battery blocks 11 can ensure the output voltage of the assembled battery 10. The number of the battery blocks 11 can be set as appropriate by taking account of the voltage required of the assembled battery 10.

Each of the battery blocks 11 has a plurality of cells (corresponding to electric storage elements) 12 connected in parallel. The parallel connection of the plurality of cells 12 can increase the full charge capacity of the battery block 11 (assembled battery 10) to extend the running distance of the vehicle with the output from the assembled battery 10. The number of the cells 12 constituting each of the battery blocks 11 can be set as appropriate by taking account of the full charge capacity required of the assembled battery 10.

Since the plurality of battery blocks 11 are connected in series, the same current passes through each of the battery blocks 11. Since the plurality of cells 12 are connected in parallel in each of the battery blocks 11, the value of a current passing through each of the cells 12 is calculated by dividing the value of the current passing through the battery block 11 by the number (total number) of the cells 12 constituting the battery block 11. Specifically, assuming that the total number of the cells 12 constituting the battery block 11 is N and the value of the current passing through the battery block 11 is Is, the value of the current passing through each of the cells 12 is calculated from Is/N. It is assumed herein that no variations occur in internal resistance among the plurality of cells 12 constituting the battery block 11.

A secondary cell such as a nickel metal hydride cell and a lithium-ion cell can be used as the cell 12. An electric double layer capacitor can be used instead of the secondary cell. For example, a 18650-type cell can be used as the cell 12. The 18650-type cell is of a so-called cylindrical type with a diameter of 18 mm and a length of 65.0 mm. The cylindrical cell has a cell case of cylindrical shape and a power-generating element performing charge and discharge housed in the cell case. The configuration of the power-generating element is described later.

Figure 3:
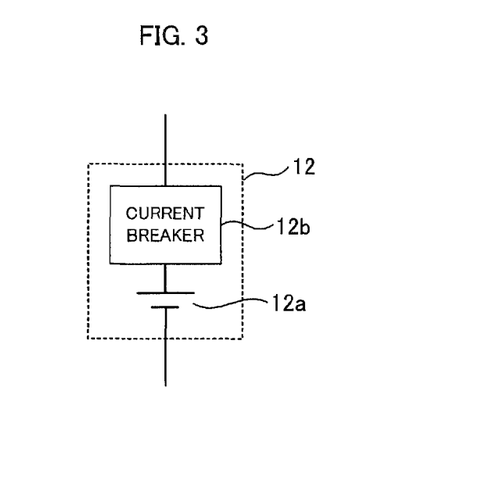
FIG. 3 is a diagram showing the configuration of a cell.

As shown in FIG. 3, the cell 12 has a power-generating element 12a and a current breaker 12b. The power-generating element 12a and the current breaker 12b are housed in a cell case providing the exterior of the cell 12. The power-generating element 12a is an element performing charge and discharge and has a positive electrode plate, a negative electrode plate, and a separator placed between the positive electrode plate and the negative electrode plate. The positive electrode plate has a collector plate and a positive electrode active material layer formed on a surface of the collector plate. The negative electrode plate has a collector plate and a negative electrode active material layer formed on a surface of the collector plate. The positive electrode active material layer includes a positive electrode active material, a conductive agent and the like, and the negative electrode active material layer includes a negative electrode active material, a conductive agent and the like.

When the lithium-ion secondary cell is used as the cell 12, the collector plate of the positive electrode plate can be made of aluminum, and the collector plate of the negative electrode plate can be made of copper, for example. $LiCo_{1/3}Ni_{1/3}Mn_{1/3}O_2$ can be used as the positive electrode active material, and carbon can be used as the negative electrode active material, by way of example. The separator, the positive electrode active material layer, and the negative electrode active material layer are impregnated with an electrolytic solution. Instead of the use of the electrolytic solution, a solid electrolyte layer may be placed between the positive electrode plate and the negative electrode plate.

The current breaker 12b is used to break a current path within the cell 12. Thus, the current breaker 12b can be operated to break the current path within the cell 12. For example, a fuse, a PTC (Positive Temperature Coefficient) element, or a current breaking valve can be used as the current breaker 12b. These current breakers 12b can be used individually or in combination.

The fuse serving as the current breaker 12b may be melted depending on the current passing through the fuse. The melted fuse can mechanically break the current path within the cell 12. This can prevent an excessive current from passing through the power-generating element 12a to protect the cell 12 (power-generating element 12a). The fuse serving as the current breaker 12b can be housed in the cell case or can be provided outside the cell case. Even when the fuse is provided outside the cell case, the fuse is provided for each of the cells 12 and is connected in series to each of the cells 12.

The PTC element serving as the current breaker 12b is placed on the current path in the cell 12, and increases the resistance as the temperature of the PTC element rises. As the current passing through the PTC element increases, the temperature of the PTC element rises with Joule heat. In response to the temperature rise of the PTC element, the resistance of the PTC element is increased to enable the current to be broken in the PTC element. This can prevent an excessive current from passing through the power-generating element 12a to protect the cell 12 (power-generating element 12a).

The current breaking valve serving as the current breaker 12b can be deformed upon increase in internal pressure of the cell 12 to break the mechanical connection to the power-generating element 12a, thereby breaking the current path within the cell 12. The cell 12 is hermetically sealed, and when gas is produced from the power-generating element 12a due to overcharge or the like, the internal pressure of the cell 12 is increased. The cell 12 (power-generating element 12a) is in an abnormal state during the production of the gas from the power-generating element 12a. In response to the increased internal pressure of the cell 12, the current breaking valve can be deformed to break the mechanical connection to the power-generating element 12a. This can prevent a charge and discharge current from passing through the abnormal power-generating element 12a to protect the cell 12 (power-generating element 12a).

A monitor unit 20 shown in FIG. 1 detects the voltage of each of the battery blocks 11 and outputs the detection result to the controller 40. A current sensor 31 detects the value of a current passing through the assembled battery 10 and outputs the detection result to the controller 40. For example in discharge of the assembled battery 10, a positive value can be used as the current value detected by the current sensor 31. In charge of the assembled battery 10, a negative value can be used as the current value detected by the current sensor 31. The current sensor 31 is only required to detect the value of the current passing through the assembled battery 10 and may be provided on the negative electrode line NL instead of the positive electrode line PL. A plurality of current sensors 31 may be used. In view of the cost and size, the single current sensor 31 is preferably provided for the single assembled battery 10 as in the present embodiment.

The controller 40 contains a memory 41 which stores a program for operating the controller 40 and particular information. The memory 41 may be provided outside the controller 40.

Figure 4:
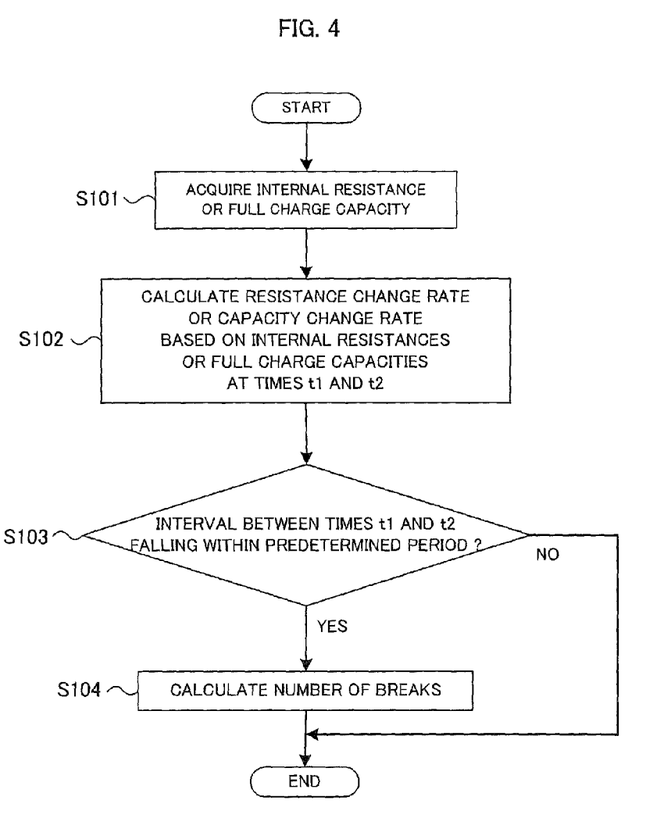
FIG. 4 is a flow chart showing processing of specifying the number of breaks in Embodiment 1.

Next, part of processing performed in the battery system of the present embodiment is described with reference to a flow chart shown in FIG. 4. The processing shown in FIG. 4 is performed by the controller 40 at predetermined intervals. The processing shown in FIG. 4 is performed for each of the battery blocks 11.

At step S101, the controller 40 acquires the internal resistance or the full charge capacity of each of the battery blocks 11. Information about the acquired internal resistance or full charge capacity is stored in the memory 41. A known method can be used appropriately as the method of acquiring the internal resistance or the full charge capacity of the battery block 11.

The method of acquiring the internal resistance of the battery block 11 (by way of example) is described.

Figure 5:
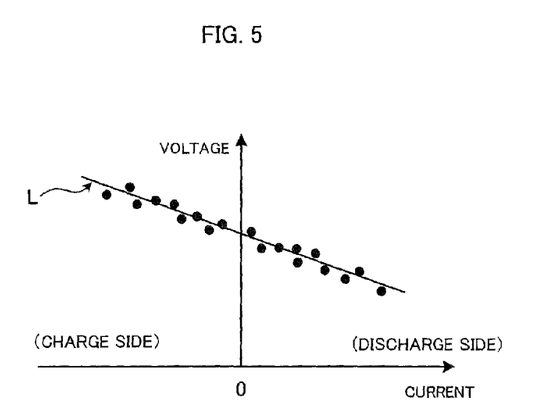
FIG. 5 is a graph for explaining how to calculate the internal resistance of a battery block.

First, a plurality of relationships between the current value and the voltage value of the battery block 11 are acquired. The controller 40 can acquire the current value of the battery block 11 based on the output from the current sensor 31. The controller 40 can acquire the voltage value of the battery block 11 based on the output from the monitor unit 20. As shown in FIG. 5, the relationship between the acquired current value and voltage value is plotted in a coordinate system in which the horizontal axis represents the current value and the vertical axis represents the voltage value. An approximate straight line L is calculated on the basis of the plurality of plotted points. The slope of the approximate straight line L corresponds to the internal resistance of the battery block 11.

Preferably, the SOC (State Of Charge) of the battery block 11 is generally constant in acquiring the current value and the voltage value of the battery block 11. The SOC refers to the proportion of the present charge capacity to the full charge capacity of the battery block 11. When the SOC of the battery block 11 is generally constant, the relationship between the current value and the voltage value is a linear relationship as shown in FIG. 5. If the SOC of the battery block 11 is changed during the acquisition of the current value and the voltage value, the relationship between the current value and the voltage value is not the linear relationship, and it is difficult to specify the slope of the straight line L, that is, the internal resistance of the battery block 11.

Next, the method of acquiring the full charge capacity of the battery block 11 (by way of example) is described.

First, the SOC of the battery block 11 is calculated (estimated) at different timings. The SOC calculated at the earlier timing is referred to as a start SOC, and the SOC calculated at the later timing is referred to as an end SOC. A known method can be used appropriately as the method of calculating the SOC. By way of example, the SOC and the OCV (Open Circuit Voltage) have a correspondence, and this correspondence is previously specified so that the SOC can be specified from the OCV.

A known method can be used appropriately as the method of calculating the OCV. For example, when the assembled battery 10 is left standing, that is, when the assembled battery 10 is not charged and discharged, the polarization of the cell 12 can be eliminated. The voltage of the battery block 11 with the polarization eliminated is acquired and this acquired voltage value can be considered as the OCV. Specifically, at the start-up of the battery system after the assembled battery 10 is left standing, the voltage of the battery block 11 is detected by the monitor unit 20 immediately after the start-up of the battery system, and the voltage detected by the monitor unit 20 can be considered as the OCV of the battery block 11.

The values of the current passing through the battery block 11 are summed in a period in which the SOC of the battery block 11 is changed from the start SOC to the end SOC, thereby calculating an integrated value Ie. The value of the current passing through the battery block 11 can be acquired by the current sensor 31. The controller 40 can calculate the full charge capacity of the battery block 11 based on the following expression (1).

$$Smax = Ie/|SOC(1) - SOC(2)| \times 100 \qquad (1)$$

In the expression (1), Smax represents the full charge capacity of the battery block 11, and Ie represents the integrated current value. SOC(1) represents the start SOC, and SOC(2) represents the end SOC.

At step S102, the controller 40 calculates a resistance change rate based on the internal resistances at times t1 and t2 acquired at step S101. The resistance change rate can be calculated on the basis of the following expression (2). Alternatively, the controller 40 calculates a capacity change rate based on the full charge capacities at the times t1 and t2 acquired at step S101. The capacity change rate can be calculated on the basis of the following expression (3).

$$Rr = R2/R1 \qquad (2)$$

$$Sr = S2/S1 \qquad (3)$$

In the expression (2), Rr represents the resistance change rate. R1 represents the internal resistance acquired at the time t1 and R2 represents the internal resistance acquired at the time t2. In the expression (3), Sr represents the capacity change rate. S1 represents the full charge capacity acquired at the time t1, and S2 represents the full charge capacity acquired at the time t2.

The times t1 and t2 represent different timings. The time t2 can be set to the present timing when the internal resistance or the full charge capacity is acquired. The time t1 can be set to the previous timing when the internal resistance or the full charge capacity is acquired. In other words, the time t1 is the timing before the time t2.

The time t1 may be the timing immediately before the time t2 or earlier. The time t1 is only required to be the timing before the time t2 and can be set as appropriate. Information about the internal resistance or the full charge capacity acquired at a timing before the time t1 can be removed from the memory 41. The removal of the unnecessary information can reserve the capacity of the memory 41.

At step S103, the controller 40 determines whether or not the interval between the times t1 and t2 is equal to or shorter than a predetermined period T. The predetermined period T can be determined on the basis of the rate at which the deterioration of the battery block 11 is advanced. In the following, a method of determining the predetermined period T is described.

Changes in internal resistance and changes in full charge capacity associated with the deterioration of the battery block 11 (cell 12) can be previously acquired by experiment. Deterioration due to wear can be contemplated as the deterioration of the battery block 11. The wear deterioration refers to deterioration due to wear of members (especially, the power-generating element 12a) forming the battery block 11 (cell 12).

Figure 6:
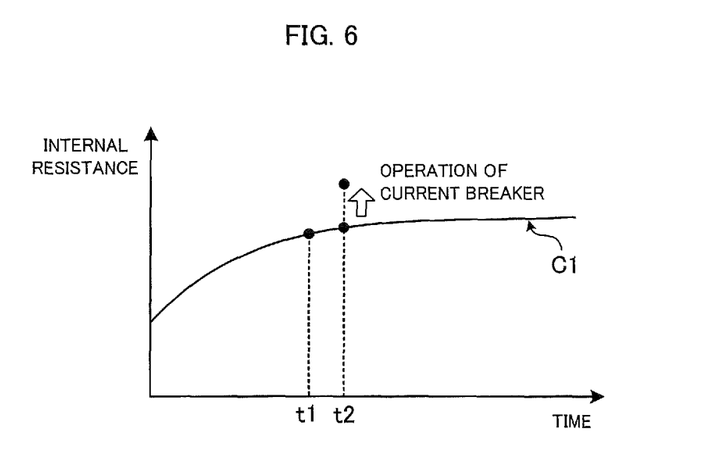
FIG. 6 is a graph showing the relationship between changes in internal resistance over time associated with wear deterioration of the battery block and the internal resistance associated with the operation of a current breaker.

The changes in internal resistance over time can be previously acquired by performing an experiment or the like in which predetermined charge and discharge are repeated in the battery block 11. The changes in internal resistance over time can be acquired in the form of a curve C1 shown in FIG. 6. As shown in FIG. 6, as the time elapses, in other words, as the wear deterioration of the battery block 11 is advanced, the internal resistance of the battery block 11 is increased.

Figure 7:
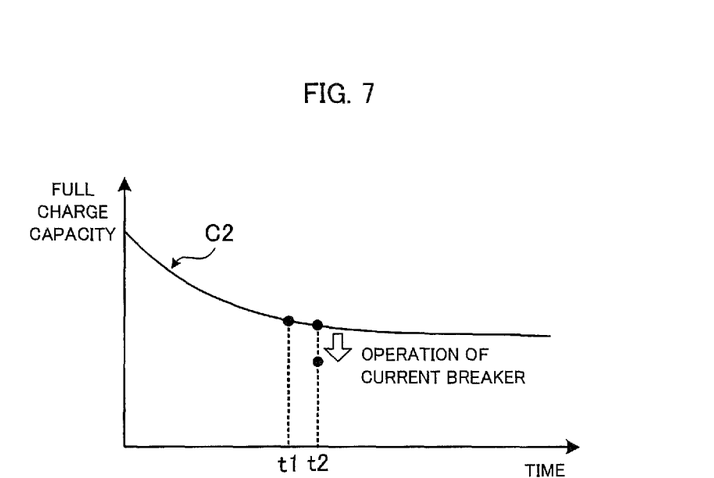
FIG. 7 is a graph showing the relationship between changes in full charge capacity over time associated with wear deterioration of the battery block and the full charge capacity associated with the operation of a current breaker.

The changes in full charge capacity over time can be previously acquired by performing an experiment or the like in which predetermined charge and discharge are repeated in the battery block 11. The changes in full charge capacity over time can be acquired in the form of a curve C2 shown in FIG. 7. As shown in FIG. 7, as the time elapses, in other words, as the wear deterioration of the battery block 11 is advanced, the full charge capacity of the battery block 11 is reduced.

When only the wear deterioration of the battery block 11 (cell 12) occurs, the internal resistances acquired at the times t1 and t2 are located on the curve C1 in FIG. 6 which shows the changes in internal resistance over time. When any current breaker 12b is operated, no current passes through the cell 12 including that current breaker 12b in the operational state, so that the internal resistance of the battery block 11 is increased immediately after the current breaker 12b is operated. In other words, the internal resistance of the battery block 11 when the current breaker 12b is operated is higher than the internal resistance associated with the wear deterioration.

The curve C1 shown in FIG. 6 can be used to specify previously a period in which the wear deterioration of the battery block 11 increases the internal resistance by a predetermined amount from the internal resistance at the time t1. When the internal resistance at the time t2 is increased by the predetermined amount from the internal resistance at the time t1 in a period shorter than that period, it can be determined that the battery block 11 experiences not only the increase in internal resistance due to the wear deterioration but also the increase in internal resistance resulting from the operation of the current breaker 12b.

The wear deterioration gradually increases the internal resistance of the battery block 11, whereas the operation of the current breaker 12b abruptly increases the internal resistance of the battery block 11. When the internal resistance of the battery block 11 is increased by the predetermined amount in a period sufficiently shorter than the period in which the wear deterioration increases the internal resistance of the battery block 11 by the predetermined amount, it can be determined that the current breaker 12b is operational. The time period can be monitored to determine whether or not the current breaker 12b is operational.

For example, it is assumed that the internal resistance of the battery block 11 is increased to 1.1 times the internal resistance at the time t1 after the lapse of six months based on the curve C1 shown in FIG. 6 when only the wear deterioration is advanced. If the internal resistance of the battery block 11 is increased to 1.1 times in the period from the time t1 to the time t2 shown in FIG. 6 even when that period is equal to or shorter than one month, it can be determined that the current breaker 12b is operational.

When only the wear deterioration of the battery block 11 (cell 12) occurs, the full charge capacities acquired at the times t1 and t2 are located on the curve C2 which shows the changes in full charge capacity over time in FIG. 7. Since the plurality of cells 12 are connected in parallel in the battery block 11, the full charge capacity of the battery block 11 is equal to the total sum of the full charge capacities of the plurality of cells 12.

When any current breaker 12b is operated, no current passes through the cell 12 including that current breaker 12b in the operational state, so that the full charge capacity of the battery block 11 is reduced by the capacity of the cell 12 in which no current passes. In other words, the full charge capacity of the battery block 11 when the current breaker 12b is operated is lower than the full charge capacity associated with the wear deterioration.

As the number of the cells 12 constituting the battery block 11 is smaller, the proportion of the full charge capacity of each cell 12 to the full charge capacity of the battery block 11 is higher. Thus, as the number of the cells 12 constituting the battery block 11 is smaller, the reduction amount of the full charge capacity associated with the operation of the current breaker 12b is increased in the battery block 11.

The curve C2 shown in FIG. 7 can be used to specify previously a period in which the wear deterioration of the battery block 11 reduces the full charge capacity by a predetermined amount from the full charge capacity at the time t1. When the full charge capacity at the time t2 is reduced by the predetermined amount from the full charge capacity at the time t1 in a period shorter than that period, it can be determined that the battery block 11 experiences not only the reduction in full charge capacity due to the wear deterioration but also the reduction in full charge capacity associated with the operation of the current breaker 12b.

The wear deterioration gradually reduces the full charge capacity of the battery block 11, whereas the operation of the current breaker 12b abruptly reduces the full charge capacity of the battery block 11. When the full charge capacity of the battery block 11 is reduced by the predetermined amount in a period sufficiently shorter than the period in which the wear deterioration reduces the full charge capacity of the battery block 11 by the predetermined amount, it can be determined that the current breaker 12b is operational. The time period can be monitored to determine whether or not the current breaker 12b is operational.

For example, it is assumed that the full charge capacity of the battery block 11 is reduced to 0.9 times the full charge capacity at the time t1 after the lapse of six months based on the curve C2 shown in FIG. 7 when only the wear deterioration is advanced. If the full charge capacity of the battery block 11 is reduced to 0.9 times in the period from the time t1 to the time t2 shown in FIG. 7 even when that period is equal to or shorter than one month, it can be determined that the current breaker 12b is operational.

At step S103, when the interval between the times t1 and t2 is longer than the predetermined period T, the processing shown in FIG. 4 is ended. The predetermined period T refers to the period in which the resistance change rate or the capacity change rate acquired at step S102 is produced only from the wear deterioration. Specifically, the predetermined period T refers to the period in which the internal resistance increase rate found in the period from the time t1 to the time t2 (resistance change rate acquired at step S102) is produced, and is specified from the curve C1 shown in FIG. 6. The predetermined period T refers to the period in which the full charge capacity reduction rate found in the period from the time t1 to the time t2 (capacity change rate acquired at step S102) is produced, and is specified from the curve C2 shown in FIG. 7.

When the interval between the times t1 and t2 is longer than the predetermined period T, the controller 40 determines that any current breaker 12b is not operational in the battery block 11. On the other hand, when the interval between the times t1 and t2 is equal to or shorter than the predetermined period T, the controller 40 proceeds to processing at step S104. In other words, when the interval between the times t1 and t2 is equal to or shorter than the predetermined period T, the controller 40 determines that any current breaker 12b is operational in the battery block 11.

At step S104, the controller 40 specifies the number of the current breakers 12b in the operational state (referred to as the number of breaks) based on the resistance change rate Rr or the capacity change rate Sr calculated at step S102.

Assuming that Ra represents the internal resistance of the battery block 11 before the operation of the current breaker 12b and that Rb represents the internal resistance of the battery block 11 after the operation of the current breaker 12b, the internal resistances Ra and Rb have the relationship shown in the following expression (4). Assuming that Sa represents the full charge capacity of the battery block 11 before the operation of the current breaker 12b and that Sb represents the full charge capacity of the battery block 11 after the operation of the current breaker 12b, the full charge capacities Sa and Sb have the relationship shown in the following expression (5).

$$Rb = Ra \times N/(N-m) \quad (4)$$

$$Sb = Sa \times (N-m)/N \quad (5)$$

In the expression (4) and the expression (5), N represents the number of the cells 12 constituting each of the battery blocks 11, that is, the number of the cells 12 connected in parallel, and m represents the total number of the current breakers 12b in the operational state (number of breaks) in each of the battery blocks 11. Since the current breaker 12b is provided for each of the cells 12, the number of breaks m corresponds to the total number of the cells 12 having the current breakers 12b in the operational state. When none of the current breakers 12b are operational in the battery block 11, the number of breaks m is equal to 0.

When any current breaker 12b is operated, the internal resistance of the battery block 11 is increased in accordance with the number of the current breakers 12b in the operational state. Specifically, as shown in the expression (4), the internal resistance Rb of the battery block 11 after the operation of the current breaker 12b is N/(N−m) times the internal resistance Ra of the battery block 11 before the operation of the current breaker 12b. Since the value of N/(N−m) is larger than 1, the internal resistance Rb is higher than the internal resistance Ra.

When any current breaker 12b is operated, the full charge capacity of the battery block 11 is reduced in accordance with the number of the current breakers 12b in the operational state. Specifically, as shown in the expression (5), the full charge capacity Sb of the battery block 11 after the operation of the current breaker 12b is (N−m)/N times the full charge capacity Sa of the battery block 11 before the operation of the current breaker 12b. Since the value of (N−m)/N is smaller than 1, the full charge capacity Sb is lower than the full charge capacity Sa.

The expression (4) and the expression (5) can be transformed into an expression (6) and an expression (7), respectively.

$$Rb/Ra = N/(N-m) \quad (6)$$

$$Sb/Sa = (N-m)/N \quad (7)$$

The value of Rb/Ra shown in the expression (6) corresponds to the value of Rr (=R1/R2) shown in the expression (2). In other words, the resistance change rate Rr calculated at step S102 is equal to the value of N/(N−m). Thus, the number of breaks m can be calculated on the basis of the resistance change rate Rr and the number (preset value) N.

When the resistance change rate Rr has an error, it is possible to define previously a range in which the error is allowable (tolerance α1) such that the number of breaks m can be calculated in view of the tolerance α1. Specifically, the value of N/(N−m) is calculated while the number m is varied, and then it is determined whether or not the resistance change rate Rr falls within the allowable range. The value calculated by adding the tolerance α1 to the calculated value N/(N−m) can be set to the upper limit value of the allowable range, and the value calculated by subtracting the tolerance α1 from the calculated value N/(N−m) can be set to the lower limit value of the allowable range.

When the resistance change rate Rr falls within the allowable range, the number m in this case can be determined as the total number of the current breakers 12b in the operational state. The tolerance α1 can be changed in accordance with the number N. Specifically, as the number N is increased, the tolerance α1 can be reduced. In other words, as the number N is reduced, the tolerance α1 can be increased.

Since the number N is previously set in the arrangement of the assembled battery 10, the tolerance α1 may be previously determined on the basis of the number N.

The value of Sb/Sa shown in the expression (7) corresponds to the value of Sr (=S1/S2) shown in the expression (3). In other words, the capacity change rate Sr calculated at step S102 is equal to the value of (N−m)/N. Thus, the number of breaks m can be calculated on the basis of the capacity change rate Sr and the number (preset value) N.

When the capacity change rate Sr has an error, it is possible to define previously a range in which the error is allowed (tolerance α2) such that the number of breaks m can be calculated in view of the tolerance α2. Specifically, the value of (N−m)/N is calculated while the number m is varied, and then it is determined whether or not the capacity change rate Sr falls within the allowable range. The value calculated by adding the tolerance α2 to the calculated value (N−m)/N can be set to the upper limit value of the allowable range, and the value calculated by subtracting the tolerance α2 from the calculated value (N−m)/N can be set to the lower limit value of the allowable range.

When the capacity change rate Sr falls within the allowable range, the number m in this case can be determined as the total number of the current breakers 12b in the operational state. The tolerance α2 can be changed in accordance with the number N. Specifically, as the number N is increased, the tolerance α2 can be reduced. In other words, as the number N is reduced, the tolerance α2 can be increased.

Since the number N is previously set in the arrangement of the assembled battery 10, the tolerance α2 may be previously determined on the basis of the number N.

In the processing shown in FIG. 4, one of the resistance change rate Rr and the capacity change rate Sr can be considered, or both of the resistance change rate Rr and the capacity change rate Sr can be considered.

While the resistance change rate Rr is calculated from the internal resistances R1 and R2 acquired at the times t1 and t2, respectively, and the number of breaks m is calculated from the resistance change rate Rr in the present embodiment, the present invention is not limited thereto.

For example, the resistance change rate Rr can be calculated from the internal resistance of the battery block 11 acquired at a predetermined time and the internal resistance at the predetermined time specified from the changes in internal resistance over time determined previously (curve C1 in FIG. 6). Specifically, the processing at step S101 includes acquiring the internal resistance of the battery block 11 and specifying the internal resistance at the same time as the processing at step S101 from the curve C1 in FIG. 6.

In the calculation of the resistance change rate Rr, the internal resistance specified from the curve C1 in FIG. 6 can be used as R1 shown in the expression (2). The internal resistance acquired in the processing at step S101 can be used as R2 shown in the expression (2). Once the resistance change rate Rr can be calculated, the number of breaks m can be calculated with the method described in the present embodiment.

While the capacity change rate Sr is calculated from the full charge capacities S1 and S2 acquired at the times t1 and t2, respectively, and the number of breaks m is calculated from the capacity change rate Sr in the present embodiment, the present invention is not limited thereto.

For example, the capacity change rate Sr can be calculated from the full charge capacity of the battery block 11 acquired at a predetermined time and the full charge capacity at the predetermined time specified from the changes in full charge capacity over time determined previously (curve C2 in FIG. 7). Specifically, the processing at step S101 includes acquiring the full charge capacity of the battery block 11 and specifying the full charge capacity at the same time as the processing at step S101 from the curve C2 in FIG. 7.

In the calculation of the capacity change rate Sr, the full charge capacity specified from the curve C2 in FIG. 7 can be used as S1 shown in the expression (3). The full charge capacity acquired in the processing at step S101 can be used as S2 shown in the expression (3). Once the capacity change rate Sr can be calculated, the number of breaks m can be calculated with the method described in the present embodiment.

Whether or not the current breaker 12b is operational is determined by determining whether or not the interval between the times t1 and t2 is equal to or shorter than the predetermined period T in the present embodiment. However, the present invention is not limited thereto.

For example, the internal resistance of the battery block 11 is acquired, and when the acquired internal resistance is higher than the internal resistance associated with the wear deterioration of the battery block 11, it can be determined that any current breaker 12b is in the operational state. In other words, when the acquired internal resistance is deviated to a higher level from the curve representing the internal resistance associated with the wear deterioration (curve C1 shown in FIG. 6), it can be determined that any current breaker 12b is in the operational state.

For example, the full charge capacity of the battery block 11 is acquired, and when the acquired full charge capacity is lower than the full charge capacity associated with the wear deterioration of the battery block 11, it can be determined that any current breaker 12b is in the operational state. In other words, when the acquired full charge capacity is deviated to a lower level from the curve representing the full charge capacity associated with the wear deterioration (curve C2 shown in FIG. 7), it can be determined that any current breaker 12b is in the operational state.

After the specification of the number of breaks m, the controller 40 can control charge and discharge of the assembled battery 10 based on the number of breaks m.

When any current breaker 12b is operated in the battery block 11, no current passes through the cell 12 having that current breaker 12b in the operational state. A current, which would pass through the cell 12 having the current breaker 12b in the operational state, passes through the other cell 12 connected in parallel to that cell 12 having the current breaker 12b in the operational state. When the value of the current Is passing through the assembled battery 10 (battery block 11) is not limited, the value of the current passing through the other cell 12 is Is/(N−m). Since the value of (N−m) is lower than the number of N, the value of the current passing through the other cell 12 is increased.

When the value of the current passing through the cell 12 is increased, that is, when the current load on the cell 12 is increased, high rate deterioration may easily occur. The high rate deterioration refers to deterioration caused by a salt concentration in the electrolytic solution of the cell 12 unbalanced to one side (positive electrode side or negative electrode side) resulting from charge or discharge performed at a high rate. Since the salt concentration unbalanced to one side suppresses the movements of ions between the positive electrode and the negative electrode, the input/output performance of the cell 12 is reduced to deteriorate the cell 12.

When the lithium-ion secondary cell is used as the cell 12, lithium may be easily precipitated. The precipitation of lithium reduces the lithium ions moving between the positive electrode and the negative electrode to reduce the full charge capacity of the cell 12. In addition, the increased value of the current passing through the cell 12 may easily operate the current breaker 12b.

Once the number of breaks m is specified, the controller 40 can determine a current command value which controls charge and discharge of the assembled battery 10 based on the number of breaks m. Specifically, the controller 40 can use the current command value to reduce the charge or discharge current of the assembled battery 10 in response to an increase in the number of breaks m. The controller 40 can set the current command value based on the following expression (8)

$$Is(2)=Is(1)\times(N-m)/N \quad (8)$$

In the expression (8), Is(1) represents the current command value before the current breaker 12b is operated, and Is(2) represents the current command value after the current breaker 12b is operated. As apparent from the expression (8), the current command value Is(2) is lower than the current command value Is(1) since the value of (N−m)/N is lower than 1.

The controller 40 can control the charge and discharge of the assembled battery 10 based on the current command value Is(2). Specifically, the controller 40 reduces the upper limit electric power to which the charge of the assembled battery 10 is allowed or reduces the upper limit electric power to which the discharge of the assembled battery 10 is allowed, on the basis of the current command value Is(2). In reducing the upper limit electric power, the upper limit electric power before the reduction can be multiplied by the value of (N−m)/N. The reduction in the upper limit electric powers to which the charge and discharge of the assembled battery 10 are allowed can limit the value of the current passing through the assembled battery 10 (cell 12).

When the number of breaks m is N, the current breakers 12b are operational in all the cells 12 constituting the battery block 11 to prevent any current from passing through the assembled battery 10. Thus, when the number of breaks m is N, the controller 40 can prevent the charge and discharge of the assembled battery 10. Specifically, the controller 40 can set 0 kW for the upper limit electric powers to which the charge and discharge of the assembled battery 10 are allowed. In addition, the controller 40 can turn off the system main relays SMR-B, SMR-G, and SMR-P.

When the number of breaks m approaches N, the charge and discharge of the assembled battery 10 can be prevented. The number of breaks m when the charge and discharge of the assembled battery 10 is prevented can be set as appropriate from the viewpoint of ensuring the running of the vehicle and the like.

The charge and discharge control for the assembled battery 10 can be performed not only during the operation of the battery system shown in FIG. 1 but also during supply of the electric power of an external power source to the assembled battery 10 or during supply of the electric power of the assembled battery 10 to an external device. The external power source refers to a power source provided outside the vehicle and can be provided by using a commercial power source, for example. The external device refers to an electronic device placed outside the vehicle and operated on the electric power received from the assembled battery 10. For example, a household electrical appliance can be used as the external device.

A charger can be used in supplying the electric power of the external power source to the assembled battery 10. The charger can convert an AC power from the external power source into a DC power and supply the DC power to the assembled battery 10. The charger can be mounted on the vehicle or can be provided outside the vehicle independently of the vehicle. In view of the voltage of the external power source and the voltage of the assembled battery 10, the charger can convert the voltage value. The controller 40 can control the operation of the charger to reduce the current value (charge current) of the assembled battery 10.

A feeding apparatus can be used in supplying the electric power of the assembled battery 10 to the external device. The feeding apparatus can convert a DC power from the assembled battery 10 into an AC power and supply the AC power to the external device. In view of the voltage of the assembled battery 10 and the operating voltage of the external device, the feeding apparatus can convert the voltage value. The controller 40 can control the operation of the feeding apparatus to reduce the current value (discharge current) of the assembled battery 10.

The limitation of the value of the current passing through the assembled battery 10 in accordance with the number of breaks m can prevent an increase in current load on the cell 12. In addition, the value of the current passing through the non-operational current breaker 12b can be limited to prevent the current breaker 12b from being operated easily.

Since the charge and discharge of the assembled battery 10 can be controlled in accordance with the number of breaks m in the present embodiment, the charge and discharge control for the assembled battery 10 can be performed efficiently. Only the detection of the operational state of the current breaker 12b may excessively limit the charge and discharge of the assembled battery 10. In contrast, the number of breaks m is determined, and the charge and discharge of the assembled battery 10 can be limited in accordance with the number of breaks m, so that the excessive limitation of the charge and discharge of the assembled battery 10 can be suppressed.

Embodiment 2

A battery system which is Embodiment 2 of the present invention will be described. Members having the same functions as those of the members described in Embodiment 1 are designated with the same reference numerals, and detailed description thereof is omitted. The following description is mainly focused on differences from Embodiment 1.

Figure 8:
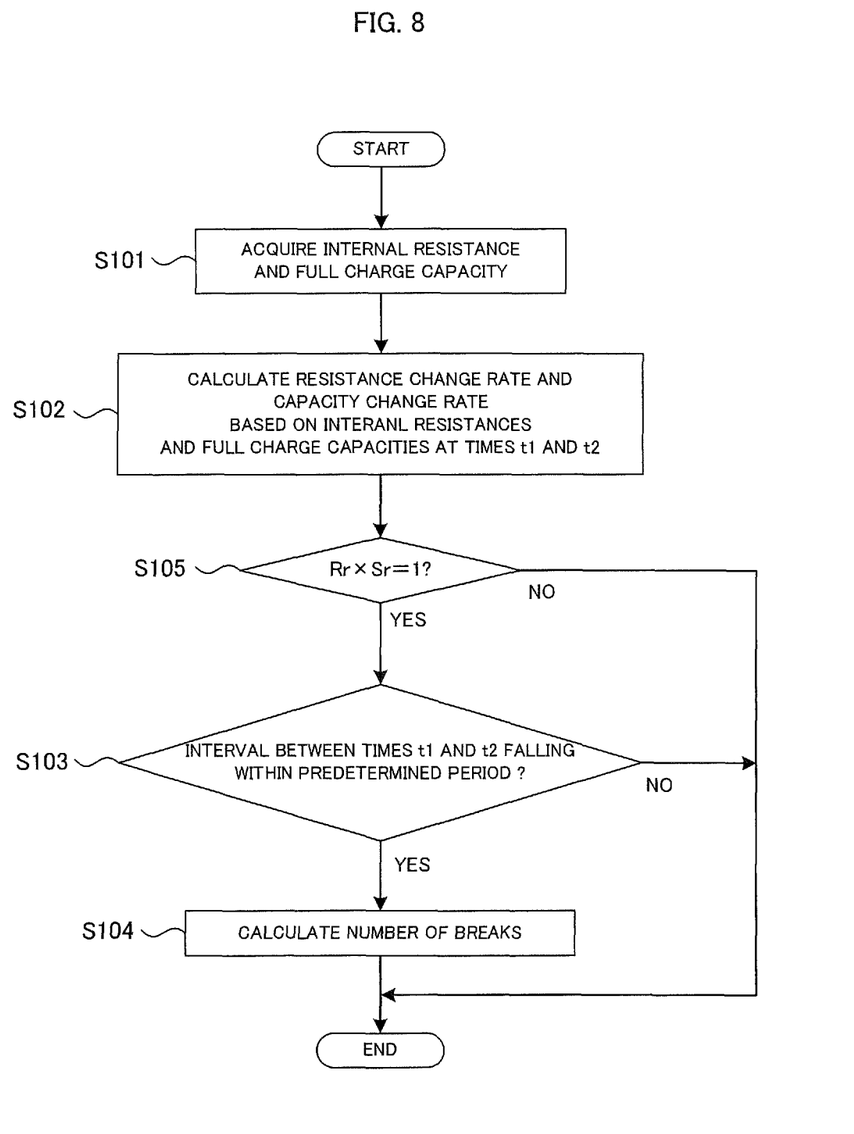
FIG. 8 is a flow chart showing processing of specifying the number of breaks in Embodiment 2.

FIG. 8 is a flow chart showing processing of specifying the number of current breakers 12b in an operational state. The processing shown in FIG. 8 is performed by a controller 40 at predetermined intervals. The processing shown in FIG. 8 is performed for each of battery blocks 11.

In FIG. 8, the same processing as that described in Embodiment 1 (FIG. 4) is designated with the same reference numeral. At step S101 in FIG. 8, the controller 40 acquires the internal resistance and the full charge capacity of each of the battery blocks 11. At step S102, the controller 40 calculates a resistance change rate Rr based on the internal resistance acquired at step S101 and calculates a capacity change rate Sr based on the full charge capacity acquired at step S101. The resistance change rate Rr and the capacity change rate Sr can be calculated with the method described in Embodiment 1.

After the processing at step S102 is performed, the controller 40 performs processing at step S105. At step S105, the controller 40 multiplies the resistance change rate Rr by the capacity change rate Sr and determines whether or not the result of the multiplication is 1.

As described in Embodiment 1, when any current breaker 12b is operational in the battery block 11, the resistance change rate Rr is equal to the value of N/(N−m), and the capacity change rate Sr is equal to the value of (N−m)/N. The multiplication of the resistance change rate Rr by the capacity change rate Sr corresponds to the multiplication of N/(N−m) by (N−m)/N, and the result of the multiplication is 1.

A range in which errors of the resistance change rate Rr and the capacity change rate Sr are allowed (tolerance β) can be set in view of the errors. The controller 40 can determine whether or not the value calculated by the multiplication of the resistance change rate Rr by the capacity change rate Sr falls within the allowable range. The value calculated by adding the tolerance β to 1 can be set to the upper limit value of the allowable range, and the value calculated by subtracting the tolerance β from 1 can be set to the lower limit value of the allowable range.

When the value calculated by the multiplication of the resistance change rate Rr by the capacity change rate Sr falls within the allowable range, the controller 40 proceeds to processing at step S103. When the value calculated by the multiplication of the resistance change rate Rr by the capacity change rate Sr falls outside the allowable range, the controller 40 ends the processing shown in FIG. 8. The processing operations shown at steps S103 and S104 are similar to the processing operations described in Embodiment 1 (steps S103 and S104 in FIG. 4).

When any current breaker 12b is operated, the resistance change rate Rr is equal to the value of N/(N−m) and, in addition, the capacity change rate Sr is equal to the value of (N−m)/N. Thus, the relationship between the resistance change rate Rr and the capacity change rate Sr can be checked to determine whether or not any current breaker 12b is operational. The consideration of both of the resistance change rate Rr and the capacity change rate Sr can improve the accuracy in determining the operational state of the current breaker 12b as compared with the case where only one of the resistance change rate Rr and the capacity change rate Sr is considered.

The deterioration of the battery block 11 includes not only the wear deterioration but also the abovementioned high rate deterioration. When the lithium-ion secondary cell is used as a cell 12, the deterioration of the battery block 11 may include deterioration due to the precipitation of lithium.

When the high rate deterioration occurs, the internal resistance of the battery block 11 is increased to a level higher than the internal resistance associated with the wear deterioration (curve C1 shown in FIG. 1). When lithium is precipitated, the full charge capacity of the battery block 11 is reduced to a level lower than the full charge capacity associated with the wear deterioration (curve C2 shown in FIG. 7). Since only the wear deterioration is considered in Embodiment 1, occurrence of the high rate deterioration may cause the internal resistance of the battery block 11 to be deviated from the curve C1 shown in FIG. 6. The precipitation of lithium may cause the full charge capacity of the battery block 11 to be deviated from the curve C2 shown in FIG. 7. In these cases, an erroneous determination of the operational state of the current breaker 12b may be made.

Since it is determined whether or not the value calculated by the multiplication of the resistance change rate Rr by the capacity change rate Sr falls within the allowable range in the present embodiment, the operational state of the current breaker 12b can be determined with the influence of the high rate deterioration and the precipitation of lithium eliminated. A time constant when the high rate deterioration occurs typically tends to differ from a time constant when the precipitation of lithium occurs. In other words, the high rate deterioration and the precipitation of lithium do not tend to occur at the same timing.

When only the high rate deterioration occurs, only the internal resistance of the battery block 11 (resistance change rate Rr) is changed to cause the value calculated by the multiplication of the resistance change rate Rr by the capacity change rate Sr to fall outside the allowable range. When only the precipitation of lithium occurs, only the full charge capacity of the battery block 11 (capacity change rate Sr) is changed to cause the value calculated by the multiplication of the resistance change rate Rr by the capacity change rate Sr to fall outside the allowable range. On the other hand, when any current breaker 12b is operated, both of the internal resistance and the full charge capacity of the battery block 11 are changed to cause the value calculated by the multiplication of the resistance change rate Rr by the capacity change rate Sr to fall within the allowable range. As a result, the determination of whether or not the value calculated by the multiplication of the resistance change rate Rr by the capacity change rate Sr falls within the allowable range can determine only the operational state of the current breaker 12b with the influence of the high rate deterioration and the precipitation of lithium eliminated.

Embodiment 3

A battery system which is Embodiment 3 of the present invention will be described. Members having the same functions as those of the members described in Embodiment 1 are designated with the same reference numerals, and detailed description thereof is omitted. The following description is mainly focused on differences from Embodiment 1.

In Embodiments 1 and 2, the resistance change rate Rr is calculated from the internal resistances acquired at the times t1 and t2, and the number of breaks m is calculated from the resistance change rate Rr. In the present embodiment, the internal resistances of a plurality of battery blocks 11 are compared to calculate the number of breaks m. This will be described specifically.

When any current breaker 12b is operated in any of the plurality of battery blocks 11 constituting an assembled battery 10, the internal resistance of the battery block 11 including that current breaker 12b in the operational state is higher than the internal resistance of the battery block 11 in which none of the current breakers 12b are operational. It is assumed in this case that all the cells 12 constituting the assembled battery 10 have an equal internal resistance. In other words, all the battery blocks 11 constituting the assembled battery 10 have an equal internal resistance.

The current breakers 12b in all the battery blocks 11 are seldom operated at the same time. The assembled battery 10 has both of the battery block 11 including the current breaker 12b in the operational state and the battery block 11 in which none of the current breakers 12b are operational.

Thus, the internal resistances of any two of the battery blocks 11 can be compared to specify the battery block 11 having the higher internal resistance. In other words, the internal resistance of the battery block 11 in which none of the current breakers 12b are operational is compared with the internal resistance of the battery block 11 including the current breaker 12b in the operational state to allow the specification of the battery block 11 including the current breaker 12b in the operational state. The internal resistance of each of the battery blocks 11 can be acquired with the method described in Embodiment 1.

The comparison of the internal resistance of one of the battery blocks 11 with the internal resistance of another one of the battery blocks 11 enables the calculation of the number of breaks m. Specifically, the resistance change rate Rr is calculated on the basis of the internal resistance of one of the battery blocks 11 and the internal resistance of another one of the battery blocks 11. While the resistance change rate Rr is calculated from the internal resistances at the times t1 and t2 in Embodiment 1, the internal resistances of the two battery blocks 11 are used in the present embodiment instead of the internal resistances at the times t1 and t2.

The method of calculating the resistance change rate Rr is similar to the method described in Embodiment 1. Specifically, the resistance change rate Rr can be calculated by using the expression (2) described in Embodiment 1. In the expression (2), the internal resistance of one battery block 11 can be used as the internal resistance R1 and the internal resistance of the other battery block 11 can be used as the internal resistance R2. The resistance change rate Rr can be calculated from the internal resistances of the two battery blocks 11, and the number of breaks m can be calculated from the resistance change rate Rr similarly to Embodiment 1.

In addition, the number of breaks m can be calculated on the basis of the full charge capacities of the plurality of battery blocks 11. Specifically, the full charge capacity of each of the battery blocks 11 is acquired, and the capacity change rate Sr is calculated on the basis of the full charge capacity of one of the battery blocks 11 and the full charge capacity of another one of the battery blocks 11. While the capacity change rate Sr is calculated from the full charge capacities at the times t1 and t2 in Embodiment 1, the full charge capacities of the two battery blocks 11 are used in the present embodiment instead of the full charge capacities at the times t1 and t2.

The method of calculating the capacity change rate Sr is similar to the method described in Embodiment 1. Specifically, the capacity change rate Sr can be calculated by using the expression (3) described in Embodiment 1. In the expression (3), the full charge capacity of one battery block 11 can be used as the full charge capacity S1 and the full charge capacity of the other battery block 11 can be used as the full charge capacity S2. The capacity change rate Sr can be calculated from the full charge capacities of the two battery blocks 11, and the number of breaks m can be calculated from the capacity change rate Sr similarly to Embodiment 1.

As described in Embodiment 2, the value calculated by multiplying the resistance change rate Rr by the capacity change rate Sr can be compared with 1 to check whether or not any current breaker 12b is in the operational state.

Alternatively, the number of breaks m can be calculated on the basis of a voltage change amount ΔV of each of the battery blocks 11 instead of the internal resistance of each of the battery blocks 11. The voltage change amount ΔV of each of the battery blocks 11 can be calculated on the basis of the following expression (9).

$$\Delta V = I \times R \quad (9)$$

In the expression (9), I represents the value of a current passing through each of the battery blocks 11 and R represents the internal resistance of each of the battery blocks 11.

Since the assembled battery 10 includes the plurality of battery blocks 11 connected in series, the values of currents I passing through the battery blocks 11 are equal to each other. When the internal resistance of each of the battery blocks 11 is changed, the voltage change amount ΔV of each of the battery blocks 11 is also changed in accordance with the change in the internal resistance. Thus, the ratio of the voltage change amount ΔV between the two battery blocks 11 can be used to calculate the number of breaks m instead of the ratio of the internal resistance between the two battery blocks 11 (resistance change rate Rr).

The internal resistance of the battery block 11 depends on the temperature and the SOC of the battery block 11. For this reason, in the calculation of the number of breaks m with the voltage change amount ΔV, the plurality of battery blocks 11 preferably have an equal temperature and an equal SOC.

Equalizing processing can be performed in the plurality of battery blocks 11 to equalize the SOCs among the plurality of battery blocks 11. The equalizing processing involves detecting the voltage of each of the battery blocks 11 and discharging the battery block 11 having a higher voltage to allow the equalizing of the voltages among the plurality of battery blocks 11. The equalizing of the voltages among the plurality of battery blocks 11 can equalize the SOCs.

The temperatures of the plurality of battery blocks 11 can be equalized by supplying a heat exchange medium to each of the battery blocks 11 to adjust the temperature of each of the battery blocks 11. A plurality of temperature sensors can be placed for the plurality of battery blocks 11 to check from the detection results of the plurality of temperature sensors whether or not the temperatures of the plurality of battery blocks 11 are equalized.

The voltage change amount ΔV is the value calculated by subtracting the OCV of each of the battery blocks 11 from the voltage (CCV: Closed Circuit Voltage) of each of the battery blocks 11 detected by the monitor unit 20. The method of acquiring the OCV of the battery block 11 is similar to the method described in Embodiment 1.

Since the number of breaks m is calculated on the basis of the voltage change amount ΔV calculated from the CCV and the OCV of the battery block 11, the calculation of the number of breaks m can be performed without using the value detected by the current sensor 31. Thus, the detection error of the current sensor 31 can be ignored.

Since the internal resistances (or the voltage change amounts) or the full charge capacities of the two battery blocks 11 are only compared in the present embodiment, it is not necessary to store the information about the previous internal resistance or full charge capacity in the memory 41 as described in Embodiment 1. This can reduce the amount of information stored in the memory 41.

The invention claimed is:

1. An electric storage system comprising:
   a plurality of electric storage blocks connected in series, each of the electric storage blocks having a plurality of electric storage elements connected in parallel;
   a plurality of current breakers, each electric storage element having one of the current breakers, each current breaker being configured to break a current path within its electric storage element; and
   a controller that for each electric storage block:
   determines a state of the electric storage block;
   acquires both an internal resistance and a full charge capacity of the electric storage block;
   calculates a first ratio between the acquired internal resistance and a reference value of internal resistance, the reference value of internal resistance being an internal resistance of an electric storage block that does not have a current breaker in a broken state;
   calculates a second ratio between the acquired full charge capacity and a reference value of full charge capacity, the reference value of full charge capacity being a full charge capacity of an electric storage block that does not have a current breaker in the broken state; and
   uses either one of the first ratio and the second ratio to calculate a number of the current breakers in the broken state in the electric storage block when a value calculated by multiplying the first ratio by the second ratio falls within an allowable range including 1 as an intermediate value thereof;
   the controller further, when the number of the current breakers in the broken state is larger than 0:

charges and/or discharges the plurality of electric storage blocks based on an upper limit electric power that is reduced as the number of the current breakers in the broken state is increased.

2. The electric storage system according to claim 1, wherein the reference value of internal resistance is an internal resistance of the electric storage block immediately prior to the acquired internal resistance, and the reference value of full charge capacity is a full charge capacity of the electric storage block immediately prior to the acquired full charge capacity.

3. The electric storage system according to claim 1, wherein
the reference value of the internal resistance is the internal resistance of one of the plurality of electric storage blocks,
the reference value of the full charge capacity is the full charge capacity of the one of the plurality of electric storage blocks, and
the one of the plurality of electric storage blocks is an electric storage block that does not have a current breaker in the broken state.

4. The electric storage system according to claim 1, wherein the acquired internal resistance is based on a voltage across the electric storage block.

5. The electric storage system according to claim 1, wherein each of the plurality of the current breakers is a fuse breaking the current path through melting, a PTC element breaking the current path through an increased resistance associated with a temperature rise, or a current breaking valve deformed in response to an increased internal pressure of its electric storage element to break the current path.

6. The electric storage system according to claim 1, wherein
the reference value of internal resistance is internal resistance that is determined based on a predetermined relationship between internal resistance and time and corresponds to a time at which the internal resistance is acquired, and
the reference value of the full charge capacity is full charge capacity that is determined based on a predetermined relationship between full charge capacity and time and corresponds to a time at which the full charge capacity is acquired.

7. The electric storage system according to claim 6, wherein the controller calculates the number of the current breakers in the broken state in the electric storage block when the acquired internal resistance is higher than the reference value of internal resistance.

8. The electric storage system according to claim 6, wherein the controller calculates the number of the current breakers in the broken state in the electric storage block when the acquired full charge capacity is lower than the reference value of full charge capacity.

9. A method of charging and/or discharging a plurality of electric storage blocks connected in series, each of the electric storage blocks having a plurality of electric storage elements connected in parallel,
each of the electric storage elements having a current breaker configured to break a current path within the electric storage element,
the method comprising, for each electric storage block:
acquiring both an internal resistance and a full charge capacity of the electric storage block;
calculating a first ratio between the acquired internal resistance and a reference value of internal resistance, the reference value of internal resistance being an internal resistance of an electric storage block that does not have a current breaker in a broken state;
calculating a second ratio between the acquired full charge capacity and a reference value of full charge capacity, the reference value of full charge capacity being a full charge capacity of an electric storage block that does not have a current breaker in the broken state; and
using either one of the first ratio and the second ratio to calculate a number of the current breakers in the broken state in the electric storage block when a value calculated by multiplying the first ratio by the second ratio falls within an allowable range including 1 as an intermediate value thereof;
the method further comprising, when the number of the current breakers in the broken state is larger than 0:
charging and/or discharging the plurality of electric storage blocks based on an upper limit electric power that is reduced as the number of the current breakers in the broken state is increased.

* * * * *